United States Patent [19]

Tsutsui

[11] Patent Number: 4,561,688
[45] Date of Patent: Dec. 31, 1985

[54] METHOD OF AND APPARATUS FOR ADSORBINGLY FIXING A BODY

[75] Inventor: Shinji Tsutsui, Yokohama, Japan
[73] Assignee: Canon Kabushiki Kaisha, Tokyo, Japan
[21] Appl. No.: 727,206
[22] Filed: Apr. 29, 1985

Related U.S. Application Data

[63] Continuation of Ser. No. 527,396, Aug. 29, 1983, abandoned.

[30] Foreign Application Priority Data

Sep. 8, 1982 [JP] Japan .................. 57-157160

[51] Int. Cl.⁴ .............................................. B66C 1/02
[52] U.S. Cl. .................................. 294/64.1; 414/737
[58] Field of Search ............... 294/64.1, 64.2, 64.3; 414/117, 118, 120, 121, 127, 737, 744 A, 752; 271/9, 30 R, 180; 248/362, 363; 355/30; 430/312

[56] References Cited

U.S. PATENT DOCUMENTS

| | | | |
|---|---|---|---|
| 3,999,795 | 12/1976 | Barker | 294/64 R |
| 4,202,623 | 5/1980 | Watkin | 355/30 |
| 4,256,829 | 3/1981 | Daniel | 430/312 |
| 4,340,234 | 7/1982 | Ise | 294/64 R |
| 4,452,577 | 6/1984 | Bouwknegt et al. | 294/64 R |

Primary Examiner—James B. Marbert
Attorney, Agent, or Firm—Fitzpatrick, Cella, Harper & Scinto

[57] ABSTRACT

A method of and an apparatus for adsorbingly fixing a body, such as a photomask (mask) or a wafer to a chuck, effect a preliminary vacuum-adsorbing step of preventing the creation of internal stress due to the temperature change between the body and the chuck before the final vacuum adsorption is effected, or effect a preliminary vacuum releasing step for relieving the created internal stress.

19 Claims, 6 Drawing Figures

METHOD OF AND APPARATUS FOR ADSORBINGLY FIXING A BODY

This application is a continuation of application Ser. No. 527,396 filed Aug. 29, 1983, now abandoned.

BACKGROUND OF THE INVENTION

1. Field of the Invention

This invention relates to a method of and an apparatus for adsorbingly fixing a body such as a mask or wafer, and more particularly to such a method and apparatus for eliminating any magnification error, with respect to the pattern of the preceding step, when a pattern of the photomask is transferred onto the semiconductor wafer in a semiconductor exposure apparatus used in the integrated circuit manufacturing process.

2. Description of the Prior Art

In the integrated circuit manufacturing process, there is a plurality of steps of projecting and transferring a mask pattern onto a semiconductor wafer. It is necessary that the mask pattern to be transferred in a subsequent step be highly accurately aligned over the entire surface of a wafer relative to the mask pattern transferred onto the wafer during the preceding step. This also holds true of the mask, but the case of the wafer is first considered. Generally, in an exposure apparatus, once a semiconductor wafer is vacuum-adsorbed to a wafer chuck, the vacuum is not released until exposure is terminated. However, it has been confirmed that if, in this condition, the wafer chuck creates a minute amount of expansion and contraction resulting from temperature changes, the wafer also is subject to an amount of expansion and contraction greater than the amount of expansion and contraction intrinsic to the wafer. For example, let it be assumed that the temperature around the chuck has risen by 0.2° C. from when silicon wafer has been absorbed to the wafer chuck made of aluminum until exposure is started and that the temperatures of the wafer and the wafer chuck also have risen correspondingly.

Heretofore, in such a case, the amount of expansion of a 5-inch wafer has been only about 0.06 $\mu$m due to the coefficient of linear expansion ($2.5 \times 10^{-6}$/°C.) of a silicon wafer and this has been considered to be a negligible amount. At the same time, however, the wafer chuck (coefficient of linear expansion: $23 \times 10^{-6}$/°C.) would expand by about 0.6 $\mu$m and so that the wafer would be pulled by the friction force between it and the chuck to exhibit an equivalent elongation, namely, an amount of expansion of approximately 0.6 $\mu$m. Accordingly, when exposure is effected in such condition, a magnification error occurs between the pattern of the preceding step and the pattern of the current step and thus, highly accurate alignment of the wafer over the entire surface thereof becomes impossible.

In recent years, various methods for controlling the temperature of the wafer to thereby align the mask pattern and the wafer pattern highly accurately have been devised. However, if the temperature of the wafer chuck changes after the wafer has been vacuum-adsorbed to the wafer chuck, the wafer is pulled by the wafer chuck because the amount of expansion and contraction of the wafer chuck is great. Therefore, expansion and contraction exceeding the amount of expansion and contraction resulting from a temperature change of the wafer itself occurs to the wafer.

Conversely, in the case where the wafer is placed on the chuck after the temperature of the wafer chuck has been stabilized, if the wafer is vacuum-adsorbed before the temperature of the wafer becomes completely equal to the temperature of the wafer chuck, there occurs a phenomenon that expansion and contraction of the wafer is prevented by the friciton force between the wafer and the chuck and a desired amount of expansion and contraction cannot be obtained.

With such phenomenon, the amount of expansion and contraction of the wafer is determined by the fricton force between the wafer and the wafer chuck and the internal stress of the wafer being balanced, and the friction force between the wafer and the wafer chuck is affected by the state of the back surface of the wafer, the state of the front surface of the wafer chuck or the presence of dust between the wafer and the wafer chuck. Therefore, the amount of expansion and contraction of the wafer cannot reliably be reproduced and, even if the amount of expansion and contraction of the wafer chuck is taken into account, it has been impossible to effect the above-described highly accurate alignment compensation.

A similar phenomenon is considered to occur also in the case of a mask and a mask chuck.

SUMMARY OF THE INVENTION

It is an object of the present invention to prevent creation of internal stress resulting from a temperature change when a body such as a mask or a wafer is vacuum-adsorbed to a chuck and/or to relieve any created internal stress.

It is another object of the present invention to prevent occurrence of a magnification error resulting from a temperature change by effecting preliminary vacuum adsorption substantially weaker than the final vacuum adsorption in a semiconductor exposure apparatus.

It is still another object of the present invention to prevent occurrence of a magnification error in a semiconductor exposure apparatus by effecting preliminary vacuum release for releasing the internal stress created as a result of a temperature change between the body and the chuck before the final vacuum adsorption is effected.

The invention will become apparent from the following detailed description thereof taken in conjunction with the accompanying drawings.

DESCRIPTION OF THE PREFERRED EMBODIMENTS

Figure 1:
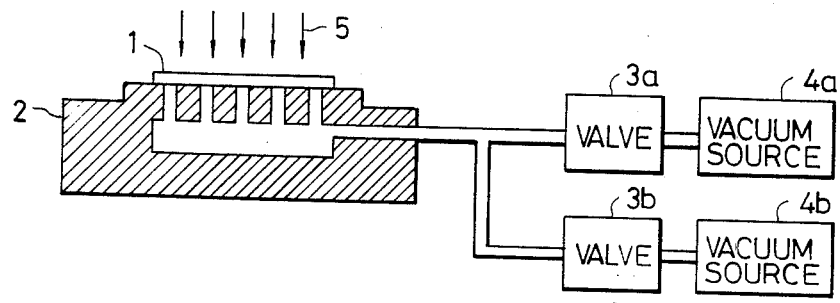
FIGS. 1, 2 and 3A, 3B and 3C show embodiments of the present invention.

Referring to FIG. 1 which shows a first embodiment of the present invention, reference numeral 1 designates a silicon wafer, reference numeral 2 denotes a wafer chuck, reference characters 3a and 3b designate valves capable of effecting ON-OFF control of a vacuum, reference character 4a denotes a vacuum source producing a very minute vacuum pressure weaker than the normal vacuum pressure effected during exposure, and reference character 4b designates a vacuum source producing the normal vacuum pressure during exposure. The process of the present embodiment is as follows.

First, the wafer 1 is carried into the wafer chuck 2. At this time, the valves 3a and 3b are closed. Thereafter, the valve 3a is opened and the wafer 1 is preliminarily vacuum-adsorbed to the chuck 2 with a very minute vacuum pressure. At this time, the temperature of the wafer 1 generally differs from the temperature of the wafer chuck 2 and the wafer 1 tries to expand or contract until the temperature of the wafer 1 becomes constant by equalling the temperature of the wafer chuck 2. Since the wafer 1 is only adsorbed by a very minute vacuum pressure, the friction force between the wafer and the wafer chuck is small or the wafer can freely expand and contract independently of the wafer chuck. The temperature of the wafer follows the temperature of the wafer chuck and the expansion or contraction of the wafer become stable. Thereafter, the valve 3b is opened immediately before exposure and the wafer is adsorbed and fixed to the chuck with the final vacuum pressure, and then exposure is started by a light beam 5 for exposure.

Figure 2:
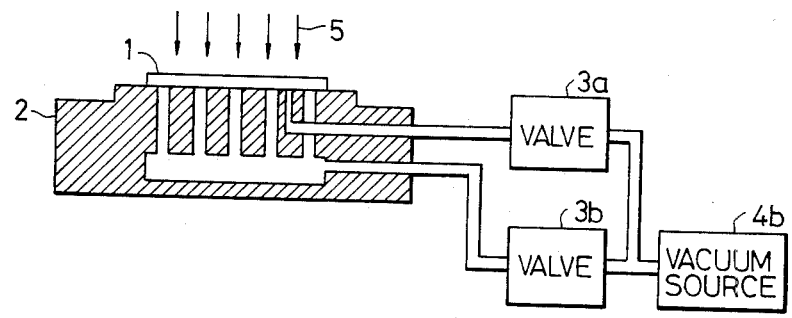

FIG. 2 shows a second embodiment of the present invention. When the wafer 1 is carried into the wafer chuck 2, a valve 3a is opened. Through a tiny hole connected to the valve 3a and provided at an arbitrary point on the chuck, the wafer 1 is preliminarily vacuum-adsorbed by a vacuum source 4b, producing the normal vacuum pressure during exposure, and is intimately fixed to the wafer chuck 2. The vacuum adsorption does not take place relative to the entire area of the wafer but rather to a partial area, particularly, a spot area of the wafer. Therefore, no friction force acts between the wafer and the wafer chuck in the portion of the chuck other than the tiny hole and the wafer can freely expand or contract with this point as the center. After the temperature of the wafer becomes the temperature of the chuck, the valve 3b is opened immediately before exposure and the final vacuum adsorption of the wafer over the entire surface thereof takes place, whereafter exposure is started by a light beam 5 for exposure.

Although, in the present embodiment, it has been described that preliminary vacuum adsorption is effected for a partial area of the wafer at the normal vacuum pressure during exposure, adsorption may of course be effected for the same partial area of the wafer at a vacuum pressure weaker than the normal vacuum pressure as described in connection with FIG. 1. That is, in this case, the valves 3a and 3b of FIG. 2 may be connected to the vacuum sources 4a and 4b, respectively, of FIG. 1.

Figure 3A:
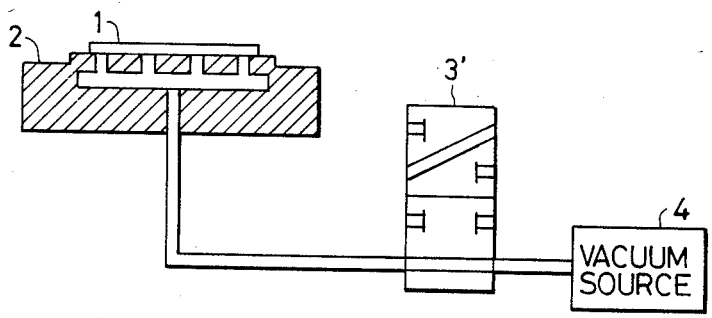
Figure 3B:
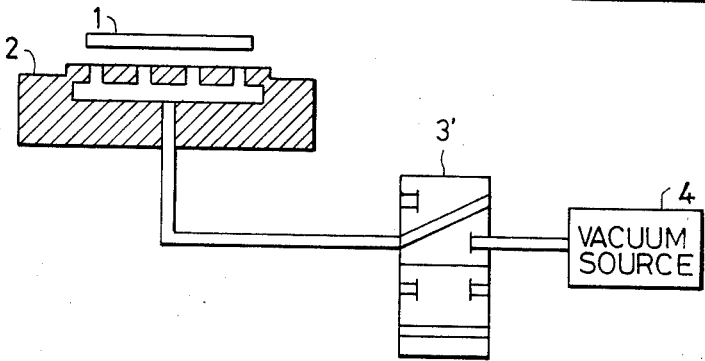
Figure 3C:
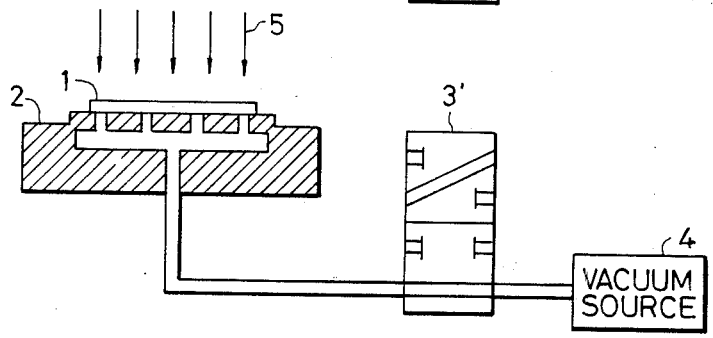

FIGS. 3A, 3C show a third embodiment of the present invention. In the previously described embodiments, a preliminary stage has been provided before the final vacuum adsorption so as not to develop internal stress, whereas in the present embodiment, no design is made to prevent internal stress from being developed, but rather a condition in which internal stress is developed is maintained and a preliminary stage is provided before the final vacuum adsorption so as to eliminate the developed internal stress.

FIG. 3A shows the tentative fixed condition; FIG. 3B shows the condition in which vacuum has been released; and FIG. 3C shows the normal vacuum-adsorbed condition.

In FIG. 3A, the wafer 1 is first carried onto the wafer chuck 2 and is vacuum-adsorbed by the vacuum source 4 during expsoure. Generally, there is a temperature difference between the wafer 1 and the wafer chuck 2. Therefore, the temperature of the wafer 1 varies until it assumes the temperature of the wafer chuck 2 and, along therewith, the wafer 1 tries to expand or contract. At this time, the expansion or contraction of the wafer 1 is prevented by the friction force between the wafer 1 and the wafer chuck 2 as previously described and stress remains in the wafer.

Therefore, as shown in FIG. 3B, a valve 3' is operated to remove the vacuum and the space between the wafer and the wafer chuck is opened to the atmosphere, whereby the internal stress of the wafer is relieved and a final stretch is imparted to the wafer. After the internal stress is removed, the wafer 1 is again vacuum-adsorbed through the valve 3' at the next moment as shown in FIG. 3C and immediately thereafter, exposure is started.

In the present embodiment, at the stage shown in FIG. 3A, use may be made of a vacuum source of weak vacuum pressure as described in connection with FIG. 1 instead of the normal vacuum source used during exposure. Vacuum adsorption may be effected for a partial area, particularly, a spot area, of the wafer as described in connection with FIG. 2 without vacuum adsorption being effected for the entire area of the wafer.

In the above-described three embodiments, the effect in the case where the temperature of the wafer 1 differs from the temperature of the wafer chuck 2 when the wafer 1 has been carried into the wafer chuck 2 has been shown. However, even if the temperature of the wafer 1 is equal to the temperature of the wafer chuck 2 at this point of time, if the temperatures of the wafer and wafer chuck later vary by some unexpected reason after the wafer 1 has been adsorbed to the wafer chuck 2, the wafer is pulled by the expansion and contraction of the wafer chuck as previously described and is expanded or contracted above the amount of expansion or contraction intrinsic to the wafer and thus, stress reamins in the wafer. Accordingly, even in such a case, the internal stress of the wafer during exposure is removed by the use of the system of the present invention and a stable amount of expansion and contraction of the wafer can be obtained.

By adopting the above-described three examples of the method of the invention, the wafer expands or contracts at an elongation percentage intrinsic to silicon wafer without being affected by the wafer chuck. The coefficient of linear expansion of silicon wafer is very small. Therefore, in the normal use of the exposure apparatus, the expansion and contraction of the wafer by heat is very minute for the variation in the ambient temperature and thus, the occurrence of a magnification error of the mask pattern and the wafer pattern resulting from an unexpected temperature change is greatly reduced.

Figure 4:
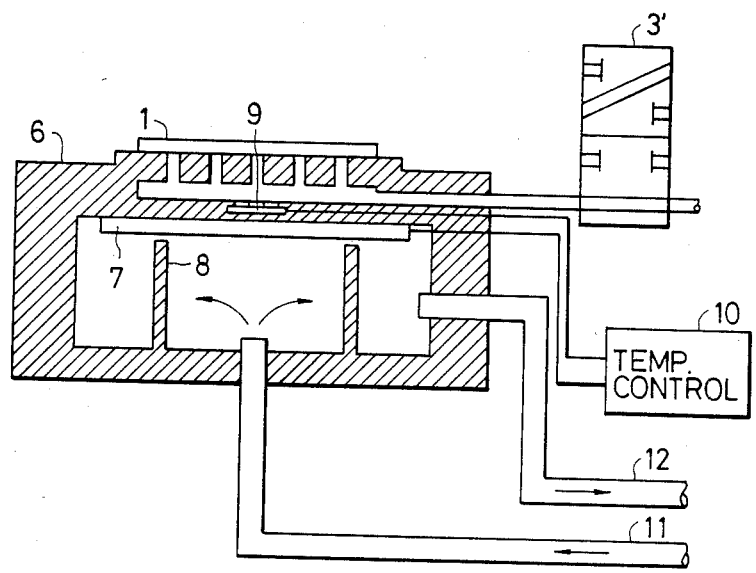
FIG. 4 shows the present invention as applied to a semiconductor exposure apparatus having a temperature control system.

FIG. 4 shows the present invention as applied to an exposure apparatus having a temperature control system. Generally, in the case where a temperature control system is present, as compared with a case where the temperature control system is absent, the internal stress of the wafer (or the mask) resulting from a temperature change is liable to occur due to the presence of a heating source or a cooling source. The present invention is effective for an exposure apparatus having such a temperature control system. FIG. 4 shows the wafer chuck portion of such exposure apparatus.

In FIG. 4, reference numeral 6 designates a wafer chuck provided with means for controlling the temperature of the wafer. This wafer chuck 6 is heated or cooled to indirectly control the temperature of the wafer 1, impart forcible expansion or contraction to the wafer 1, and thereby achieve alignment of the mask pattern of a mask, not shown, and the wafer pattern on the wafer 1, with a result that the magnification error when the mask pattern is transferred to the wafer is eliminated.

In FIG. 4, reference numeral 10 designates a temperature control device adapted to be heated by a heating resistor 7 and cooled by a air flow.

Reference numeral 8 denotes a radiator plate, reference numeral 9 designates a temperature measuring resistor, and reference numerals 11 and 12 denote a cooling air inlet and a cooling air outlet, respectively.

In such an apparatus, it is assumed that the temperature of the wafer chuck 6 is set to a level higher by several degrees than the room temperature and is stable in this state.

The wafer 1 is carried onto the chuck and is vacuum-adsorbed to the wafer chuck 6. The temperature of the wafer 1 is caused to follow the temperature of the chuck.

When some time (five to ten seconds) elapses, the temperature of the wafer becomes equal to the temperature of the chuck, but thermal expansion is suppressed by the friction force between the back surface of the wafer and the front surface of the chuck and thus, a desired amount of expansion cannot be obtained.

Therefore, as shown in FIG. 3, the valve 3′ is changed over for a short time to release the vacuum, whereby the residual stress in the wafer can be relieved with a result that expansion or contraction corresponding to the coefficient of thermal expansion intrinsic to silicon wafer is obtained. The present embodiment is similar to the embodiment described in connection with FIGS. 3A, 3C in that the wafer 1 is again adsorbed to the wafer chuck 6 immediately before exposure. The embodiments described in connection with FIGS. 1 and 2 may of course be adopted to this apparatus.

Although the mask and the mask chuck have not been described, the relation between the mask and the mask chuck is similar to the relation between the wafer and the wafer chuck.

In the above-described embodiments, silicon single crystal has been mentioned as the material of the semiconductor wafer substrate, but a similar concept is also applicable to other wafer substrate materials such as GaAs, SOS or quartz substrate and a sufficient effect can be expected by carrying out the present invention. Also, not only one step but also plural steps of preliminary vacuum adsorption or preliminary vacuum release may be effected before exposure.

According to the present invention, as described above, one of the causes which have prevented highly accurate alignment of the mask and the wafer over the entire surfaces thereof due to occurrence of a magnification error can be eliminated to achieve highly accurate alignment.

What I claim is:

1. A method of securing a body in a fixed position, said method comprising:
    a first vacuum-adsorbing step of preliminarily vacuum-adsorbing said body to a chuck; and
    a second vacuum-adsorbing step of vacuum-adsorbing said body to said chuck after said first vacuum adsorbing step;
    the vacuum adsorption produced by said first step being substantially weaker than the vacuum adsorption produced by said second step so as to relieve internal stress in said body, which results from a change in temperature of said body and said chuck.

2. A method according to claim 1, wherein the degree of vacuum which produces the vacuum adsorption of said first step and said second step is substantially the same but wherein the adsorption area upon which the vacuum operates in the first step is smaller than the adsorption area upon which the vacuum operates in said second step.

3. A method according to claim 1, wherein the vacuum adsorption area upon which the vacuum operates in said first step and in said second step is substantially the same but wherein the degree of vacuum operating in said first step is weaker than the degree of vacuum operating in said second step.

4. A method according to claim 2, wherein the adsorption area of the vacuum adsorption of said first step is a spot area.

5. A method of securing a body in a fixed position, said method comprising:
    a first vacuum-adsorbing step of vacuum-adsorbing said body to a chuck;
    a step of releasing vacuum adsorption after said first vacuum-adsorbing step so as to relieve internal stress in said body, which results from change in temperature of at least one of said body and said chuck; and
    a second vacuum-adsorbing step of again vacuum-adsorbing said body to said chuck after said vacuum releasing step.

6. A method according to claim 5, wherein the vacuum-adsorption of said first step and the vacuum adsorption of said second step are substantially of the same degree.

7. A method according to claim 5, wherein the vacuum adsorption of said first step is substantially weaker than the vacuum adsorption of said second step.

8. A method according to claim 7, wherein the the degree of vacuum which produces the vacuum adsorption of said first step and said second step is substantially the same but wherein the adsorption area upon which the vacuum operates in the first step is smaller than the adsorption area upon which the vacuum operates in said second step.

9. A method according to claim 7, wherein the vacuum adsorption area upon which the vacuum operates in said first step and in said second step is substantially the same but wherein the degree of vacuum operating in said first step is weaker than the degree of vacuum operating in said second step.

10. A method according to claim 8, wherein the adsorption area of the vacuum adsorption of said first step is a spot area.

11. An apparatus for securing a body in a fixed position, said apparatus comprising:
    a chuck having a supporting surface for receiving the body;
    means provided near said chuck for controlling the temperature of said chuck;
    vacuum-adsorbing means for producing a vacuum for vacuum-adsorbing the body to said supporting surface; and
    vacuum releasing means for releasing the vacuum produced by said vacuum-adsorbing means to release vacuum adsorption of the body to said surface after a preliminary vacuum adsorption of the body to said surface and prior to a subsequent vacuum adsorption so as to relieve internal stress in the body, which results from a change in temperature of at least one of the body and the chuck.

12. An apparatus according to claim 11, wherein said vacuum-adsorbing means produces substantially the same degree of vacuum for preliminary vacuum adsorption and the subsequent vacuum adsorption.

13. An apparatus according to claim 11, wherein said vacuum-adsorbing means produces a degree of vacuum for the preliminary vacuum adsorption that is substantially weaker than that produced for the subsequent vacuum adsorption.

14. An apparatus according to claim 13, wherein said vacuum adsorbing means produces substantially the same degree of vacuum for the preliminary vacuum adsorption and for the subsequent vacuum adsorption but wherein said vacuum adsorbing means produces a vacuum over a smaller adsorption area during the preliminary vacuum adsorption than it does during the subsequent vacuum adsorption.

15. An apparatus according to claim 13, wherein said vacuum adsorbing means produces a vacuum over substantially the same adsorption area in the preliminary vacuum adsorption and the subsequent vacuum adsorption but wherein said vacuum adsorbing means produces a weaker degree of vacuum during the preliminary vacuum adsorption that it does during the subsequent vacuum adsorption.

16. An apparatus according to claim 14, wherein said vacuum-adsorbing means produces a vacuum in the preliminary vacuum adsorption that operates over an adsorption area that is a spot area.

17. An apparatus according to claim 11, wherein said vacuum-adsorbing means is operative to produce the subsequent vacuum adsorption after release of the preliminary vacuum adsorption by said releasing means after the temperature of the body reaches the temperature of said chuck.

18. A semiconductor exposure apparatus for exposing a wafer with a pattern carried on a mask, said apparatus comprising:
   a mask chuck for adsorbing a mask;
   a wafer chuck for adsorbing a wafer;
   means for controlling the temperature of at least one of said mask chuck and said wafer chuck;
   vacuum-adsorbing means for producing a vacuum for vacuum-adsorbing a mask and a wafer to said mask chuck and said wafer chuck, respectively; and
   releasing means for releasing the vacuum adsorption of at least one of the mask and the wafer to the one of said mask chuck and said wafer chuck, the temperature of which is controlled by said controlling means, after a preliminary vacuum adsorption so as to mitigate internal stress in the one of the mask and the wafer which results from change in temperature of the one of the mask and the wafer and said at least one of said mask chuck and said wafer chuck.

19. An apparatus for securing a body in a fixed position, said apparatus comprising:
   a chuck for having a supporting surface for receiving the body;
   vacuum-adsorbing means for producing a vacuum for vacuum-adsorbing the body to said supporting surface; and
   vacuum controlling means for so controlling said vacuum-adsorbing means to produce a preliminary vacuum for preliminarily vacuum-adsorbing the body to said surface and a final vacuum for finally vacuum-adsorbing the body to the surface, the preliminary vacuum being substantially weaker than the final vacuum in order to mitigate residual internal stress in the body resulting from a temperature change of at least one of the body and said chuck.

* * * * *

UNITED STATES PATENT AND TRADEMARK OFFICE
CERTIFICATE OF CORRECTION

PATENT NO. : 4,561,688

DATED : December 31, 1985

INVENTOR(S) : SHINJI TSUTSUI

Page 1 of 2

It is certified that error appears in the above-identified patent and that said Letters Patent is hereby corrected as shown below:

COLUMN 1

Line 37, "when silicon" should read --when a silicon--.
    Line 48, "and" should be deleted.

COLUMN 2

Line 7, "friciton" should read --friction--.
    Line 11, "fricton" should read --friction--.
    Line 58, "1 which" should read --1, which--.

COLUMN 3

Line 12, "or" should read --and--.
    Line 13, "and" should read --or--.
    Line 50, "3A, 3C" should read --3A to 3C--.
    Line 66, "expsoure." should read --exposure.

COLUMN 4

Line 37, "reamins" should read --remains--.

COLUMN 5

Line 10, "a" should read --an--.
    Line 36, "3A, 3C" should read --3A to 3C--.
    Line 39, "adopted to" should read --adapted to--.

UNITED STATES PATENT AND TRADEMARK OFFICE
CERTIFICATE OF CORRECTION

PATENT NO. : 4,561,688　　　　　　　　　　　　　Page 2 of 2

DATED : December 31, 1985

INVENTOR(S) : SHINJI TSUTSUI

It is certified that error appears in the above-identified patent and that said Letters Patent is hereby corrected as shown below:

COLUMN 6

Line 40, "the the" should read --the--.

COLUMN 7

Line 30, "that" should read --than--.

Signed and Sealed this

Seventeenth Day of November, 1987

Attest:

DONALD J. QUIGG

Attesting Officer　　　　　Commissioner of Patents and Trademarks